United States Patent
Grantham et al.

(10) Patent No.: US 7,115,168 B2
(45) Date of Patent: Oct. 3, 2006

(54) PATTERNED THIN-FILM DEPOSITION USING COLLIMATING HEATED MASKED ASSEMBLY

(75) Inventors: Daniel Harrison Grantham, Glastonbury, CT (US); Thomas Samuel Phely-Bobin, Marlborough, MA (US); Fotios Papadimitrakopoulos, Vernon, CT (US); Faquir C. Jain, Storrs, CT (US)

(73) Assignee: Optoelectronic Systems, Storrs, CT (US)

( * ) Notice: Subject to any disclaimer, the term of this patent is extended or adjusted under 35 U.S.C. 154(b) by 0 days.

(21) Appl. No.: 11/045,034

(22) Filed: May 3, 2005

(65) Prior Publication Data

US 2005/0183670 A1     Aug. 25, 2005

Related U.S. Application Data

(62) Division of application No. 10/252,884, filed on Sep. 24, 2002, now abandoned.

(51) Int. Cl.
*C23C 14/04* (2006.01)

(52) U.S. Cl. .................. 118/720; 118/724; 118/726

(58) Field of Classification Search ............... 118/721, 118/722, 724, 726, 720
See application file for complete search history.

(56) References Cited

U.S. PATENT DOCUMENTS

| | | | | |
|---|---|---|---|---|
| 3,864,239 A | * | 2/1975 | Fletcher et al. | 204/298.06 |
| 4,373,470 A | * | 2/1983 | Martin | 118/720 |
| 5,223,108 A | * | 6/1993 | Hurwitt | 204/192.12 |
| 5,330,628 A | * | 7/1994 | Demaray et al. | 204/192.12 |
| 5,643,428 A | * | 7/1997 | Krivokapic et al. | 204/298.11 |
| 5,770,026 A | * | 6/1998 | Lee | 204/298.11 |
| 5,937,272 A | * | 8/1999 | Tang | 438/30 |
| 6,132,805 A | * | 10/2000 | Moslehi | 427/248.1 |
| 6,217,730 B1 | * | 4/2001 | Nakajima et al. | 204/298.11 |
| 6,521,010 B1 | * | 2/2003 | Katata | 55/434 |
| 2002/0011205 A1 | * | 1/2002 | Yamazaki et al. | 118/620 |
| 2002/0076847 A1 | * | 6/2002 | Yamada et al. | 438/34 |

FOREIGN PATENT DOCUMENTS

| | | | |
|---|---|---|---|
| JP | 10-168559 | * | 6/1998 |
| JP | 2000-282219 | * | 10/2000 |

* cited by examiner

*Primary Examiner*—Richard Bueker
(74) *Attorney, Agent, or Firm*—H. C. Lin, Patent Agent

(57) ABSTRACT

Scanning localized evaporation and deposition of an evaporant on a substrate utilizes a mask assembly comprised of a series of mask elements with openings thereon and spaced apart in a stack. The openings are aligned so as to direct the evaporant therethrough onto the substrate. The mask elements are heated and the stack may include a movable shutter element to block openings in adjacent mask elements. The evaporant streams are usually vertical but some may be oblique to the substrate, and they may be of different materials.

5 Claims, 10 Drawing Sheets

PATTERNED THIN-FILM DEPOSITION USING COLLIMATING HEATED MASKED ASSEMBLY

This application is a division of application Ser. No. 10/252,884, filed Sep. 24, 2002, now abandoned.

BACKGROUND OF THE INVENTION

The present invention is directed to a method for improving the deposition of patterned thin films using a scanning localized evaporation methodology (SLEM) incorporating a collimating mask assembly for producing multilayered electronic and photonic devices, such as transistors, sublimable organic light-emitting diodes (OLEDs), photonic band gap structures, and integrated circuits and systems.

The growth of ultra-thin organic films currently involves predominantly the use of high vacuum,[1, 2] Langmuir-Blodgett film deposition,[3–5] or self-assembled monolayers.[6–11] Typically, producing high resolution patterns in these films requires the use of lithographic techniques that enable the selective removal of portions of the deposited layers.[12, 13] Lately, soft stamping[14–18] and ink-jet printing[19–22] have permitted direct patterned depositions of polymeric semiconductors. More recently, a scanning localized evaporation methodology (SLEM) has been invented.[23] This process features close proximity, selective deposition of thin films in patterns suitable for fabrication of electronic, optoelectronic and photonic devices. In addition, high deposition rates and improved material economy are realized.

As a result, the definition of high fidelity patterns in deposited thin films is generally obtained through the use of a variety of photolithographic and etching techniques. Ink-jet printing technologies usually employ microwells to contain deposited microdroplets of ink and limit its spreading while drying. Direct vacuum deposition of patterned films requires the use of shadow masks that usually are in direct contact with the substrate, in which case they are termed contact masks. Contact masks typically exhibit the following limitations:
  i) fine-sized features are prone to clogging due to material deposition along the edges of the openings;
  ii) in the contact mode, mask removal can cause scratching of the deposited pattern;
  iii) large area contact masks are prone to warping and distortion;
  iv) circular stand-alone pattern elements cannot be supported (such as the letter "P", "O", etc . . . ).

In the case of scanning localized evaporation methodology (SLEM), the above limitations are partially addressed through:
1. heating of the mask to avoid material deposition along the edges of the openings and to prevent the accompanying clogging of fine features;
2. separating the mask from the substrate by a finite distance, thus preventing scratching of the deposited pattern;
3. the use of the scanning feature in SLEM to permits use of small area shadow masks, thereby considerably reducing the warping and distortion,
4. Circular stand-alone pattern element can be implemented by either of two methods:
   i) The scanning of a smaller spot to define the desired pattern
   ii) Superposition of one or more patterns to construct annular elements (i.e. in the case of "P", use of "I" and "⁼").

As discussed above, pattern definition in the SLEM technique is greatly dependent on the mask to substrate separation. Reduction in this spacing between the mask and substrate improves the resolution. However, increased radiation adversely affects the quality of the deposited films as the spacing between substrate and heated mask decreases.

FIG. 1 schematically illustrates the basic operating principle of the SLEM process as developed by Applicants and which is the subject matter of our prior application for Letters Patent Ser. No. 10/159,670, filed Jun. 3, 2002. Herein, on a cylindrical transport mechanism 1, an array of heating elements 2 is mounted, each of which can be energized individually through appropriately placed electrodes 3 selectively powered with electrical commutators 4 at desired locations (i.e., opposite a shadow mask 7). A loading source 5 deposits the evaporant 6 on the heating elements 2. Upon rotation to a position adjacent the substrate 8, the evaporant material 6 is re-evaporated from the surface of the selected heating element 2 and passes through the shadow mask 7. The mask generally consists of a rigid plate with openings 100 forming a pattern dictated by the structural requirements of the device under fabrication.

FIG. 2 illustrates a magnified cross-section around the shadow mask. This includes a portion of the rotor 1 with a number of heating elements 2 between a set of electrodes 3. The heating elements are powered by two electrical commutators 4. The width of the commutators 4 and the angular speed of the rotor 1 defines the time of evaporation. During this time the heating element 2 between the two electrodes containing the commutators is powered to re-evaporate the evaporant 6, which has been earlier deposited at the loading station 5 (shown in FIG. 1). Resistive heating of the shadow mask 7 through the electrical terminals 9 prevents the deposition of the evaporant onto the mask, thereby keeping the fine mask openings 100 free from clogging.

Because of the natural divergence of the evaporant flux, obtaining high-fidelity patterns requires close proximity of the mask to the substrate shown in FIG. 2A as opposed to the configuration of FIG. 2B, which has a larger mask to substrate separation. The configuration of FIG. 2A however, presents a number of limitations: (a) close proximity is prone to mechanical damage of the evaporant deposit film when the substrate is translated to another location; and (b) fine patterns generally become clogged due to material deposition along the edges of the openings, resulting in the gradual distortion of pattern shape and sizes. Mask clogging can be avoided by heating the mask to a temperature at which material deposition on the mask does not take place. The heating of the mask in close proximity to the substrate can however adversely affect the quality of the deposited layer.

It is an object of the present invention to provide a novel SLEM method using collimating apparatus for generation of closely controlled patterns on the substrate.

It is also an object to provide a novel collimating mask assembly for generating closely controlled patterns on a substrate.

SUMMARY OF THE INVENTION

This invention describes a heated shadow mask assembly capable of producing high-resolution features in thin films deposited through the mask. The central feature of this mask assembly is the integration of multiple masks with identical patterns, aligned and spaced in a specific manner to produce well collimated streams of evaporant. In addition, this mask assembly may provide unique features including:

(i) precise control over the temperature gradient in the vicinity of both evaporating source and substrate; and
(ii) angle of incidence controlled deposition to produce specific deposition profiles; and
(iii) a built-in shutter mechanism to allow precise timing of deposition intervals.

The use of this mask assembly in scanning localized evaporation methodology (SLEM) reduces undesired substrate heating and improves film thickness uniformity, resulting in high fidelity pattern definition.

The term "alignment" as used herein includes substantially exact vertical alignment of all margins of the apertures in the masks of the stack and oblique alignment in which the apertures are offset along at least one axis to provide an oblique path for the vaporized material in offset axis.

The heated shadow mask assembly is constructed of a multiplicity of individual shadow masks, stacked one above the other, with their apertures aligned in such a way that free passage of the vapor stream therethrough is allowed. These individual masks can be constructed from electrically resistive material, to permit precise temperature control at each level of the mask assembly. In addition, proper choice of spacing of the individual mask elements eliminates diagonal passage through a periodic set of apertures.

According to the present invention, the temperature gradient throughout the multileveled, stacked mask can be tuned by a variety of means. For the same mask material, the individual mask thickness and its proximity to other masks sets its temperature for a given power input. Controlling the current flowing though each mask permits greater flexibility in designing the differential temperature profile from top to bottom. This embodiment permits the temperature of the mask closest to the substrate to be maintained at a temperature lower than that of the other masks and the evaporating source. Off axis alignment of apertures in such mask assembly permits angle of incidence controlled deposition profiles.

In another version of this invention, a multilevel collimating mask assembly includes a shutter mechanism.

BRIEF DESCRIPTION OF THE ATTACHED DRAWINGS

FIG. 8B illustrates the closed shutter configuration of FIG. 8A; and

FIG. 8D illustrates the closed position of the shutter in FIG. 8C.

DETAILED DESCRIPTION OF THE INVENTION

Figure 1:
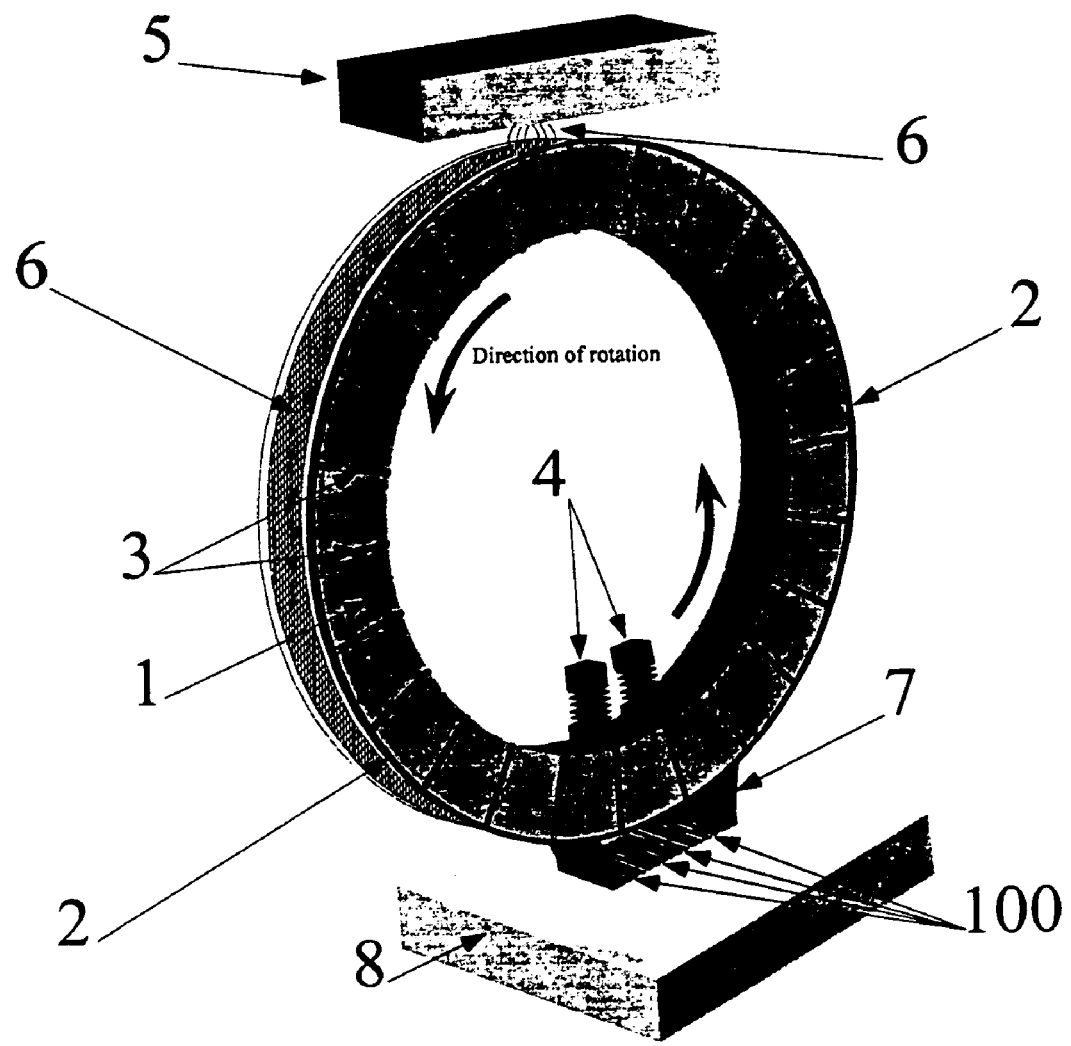
FIG. 1 is a three-dimensional illustration of the basic scanning localized evaporation methodology (SLEM) unit employed for the localized evaporation of a variety of materials from a close proximity source through a shadow mask onto a substrate.
Figure 2:
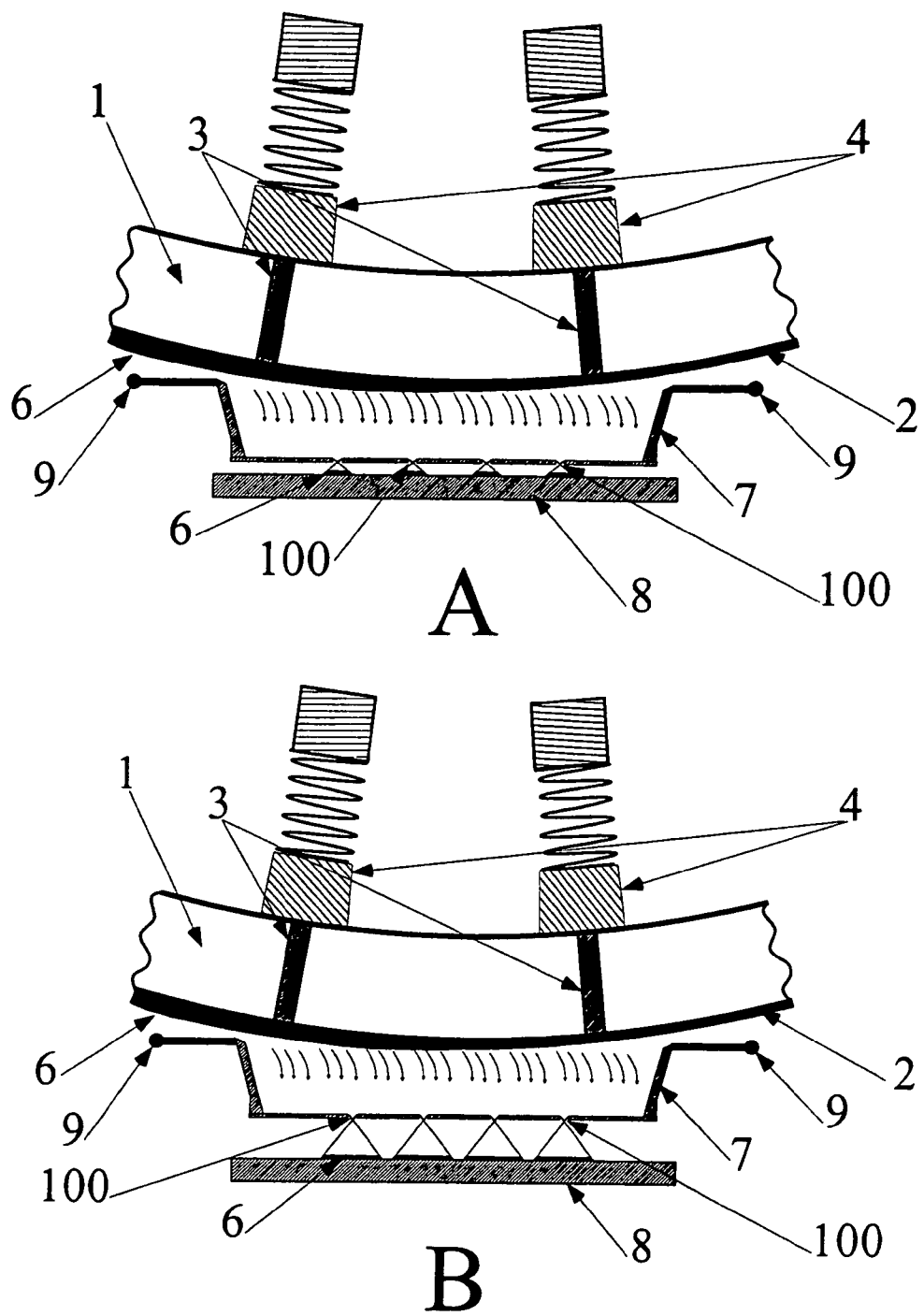
FIGS. 2A and 2B are enlarged views of a single shadow mask element and the resulting deposition when the mask is in close proximity to the substrate (FIG. 2A), and when located at a substantial distance away from the substrate (FIG. 2B)
Figure 3:
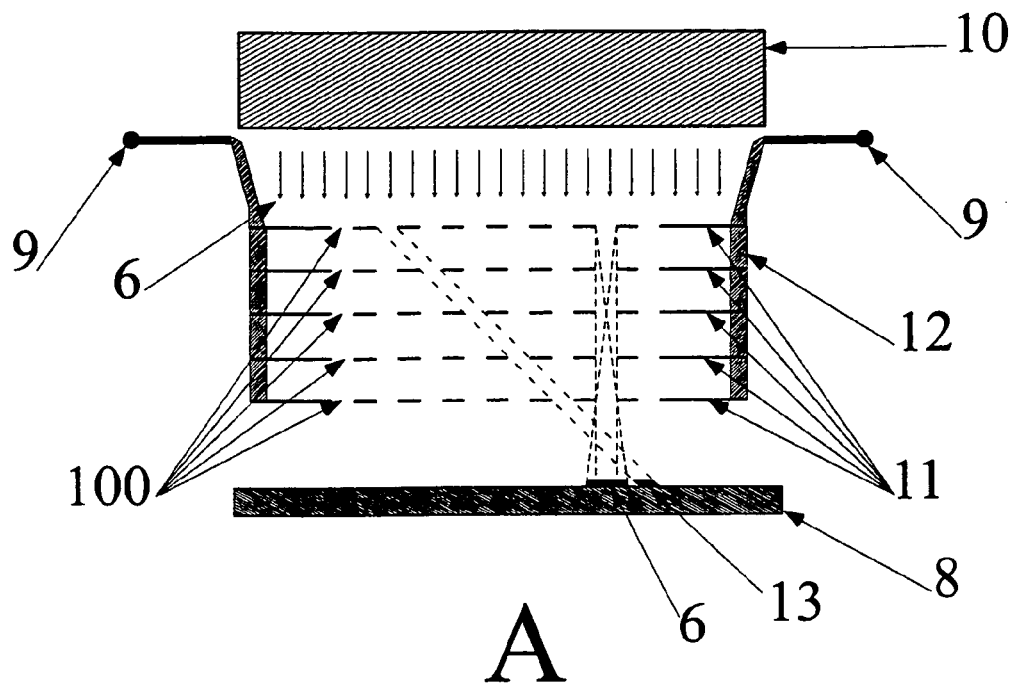
FIGS. 3A and 3B are schematic illustration of a heated collimating mask assembly comprised of a multiplicity of shadow mask elements stacked (FIG. 3A) equidistantly, and (FIG. 3B) aperiodically one above the other, with their apertures aligned in such a way that free passage of the evaporant stream is allowed.
Figure 3:
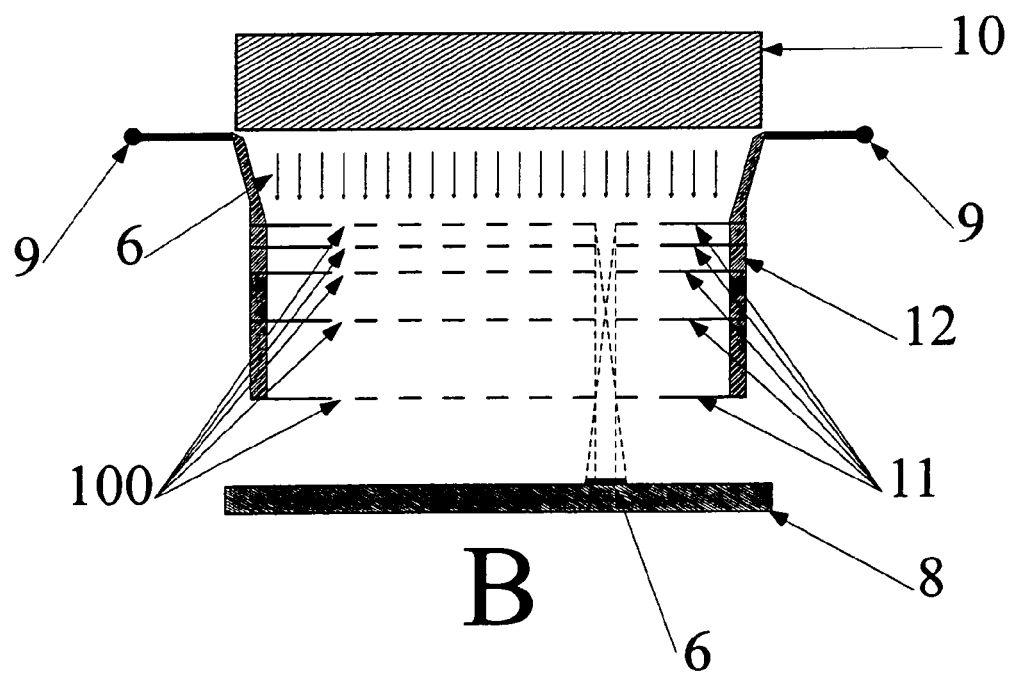

The present invention utilizes a multilevel heated collimating shadow mask assembly that resolves the problems discussed hereinbefore. FIGS. 3A and 3B show two embodiments of such an assembly, constructed of a multiplicity of individual shadow masks 11, stacked equidistantly (FIG. 3A) or aperiodically (FIG. 3B). In both cases, the apertures or openings 100 in all of the individual shadow masks are vertically aligned with respect to each other, allowing free passage of the vapor stream from the generic evaporating heating element 10 to the substrate 8. Moreover, each of the masks 11 is fabricated from an electrically resistive material. Passing current through the contacts 9 and 12 resistively heats this mask assembly to prevent the clogging of the mask openings 100 caused by deposition of the evaporant 6 onto the masks 11. The heated collimating mask assembly provides the necessary collimation of the vapor stream material 6 for deposition of high definition patterns of material 6. Moreover, the increased substrate to mask separation alleviates adverse heating that might affect the morphology of the deposited thin films.

In FIG. 3A however, the equidistant spacing between shadow masks 11 creates diagonal vapor passages at certain angles, resulting in a spurious deposit 13. This depends on the specific geometries of mask apertures, their lateral separation and mask-spacing period. An aperiodic stacking of such heated shadow mask elements as seen in FIG. 3B eliminates the spurious diagonal deposition.

Figure 4:
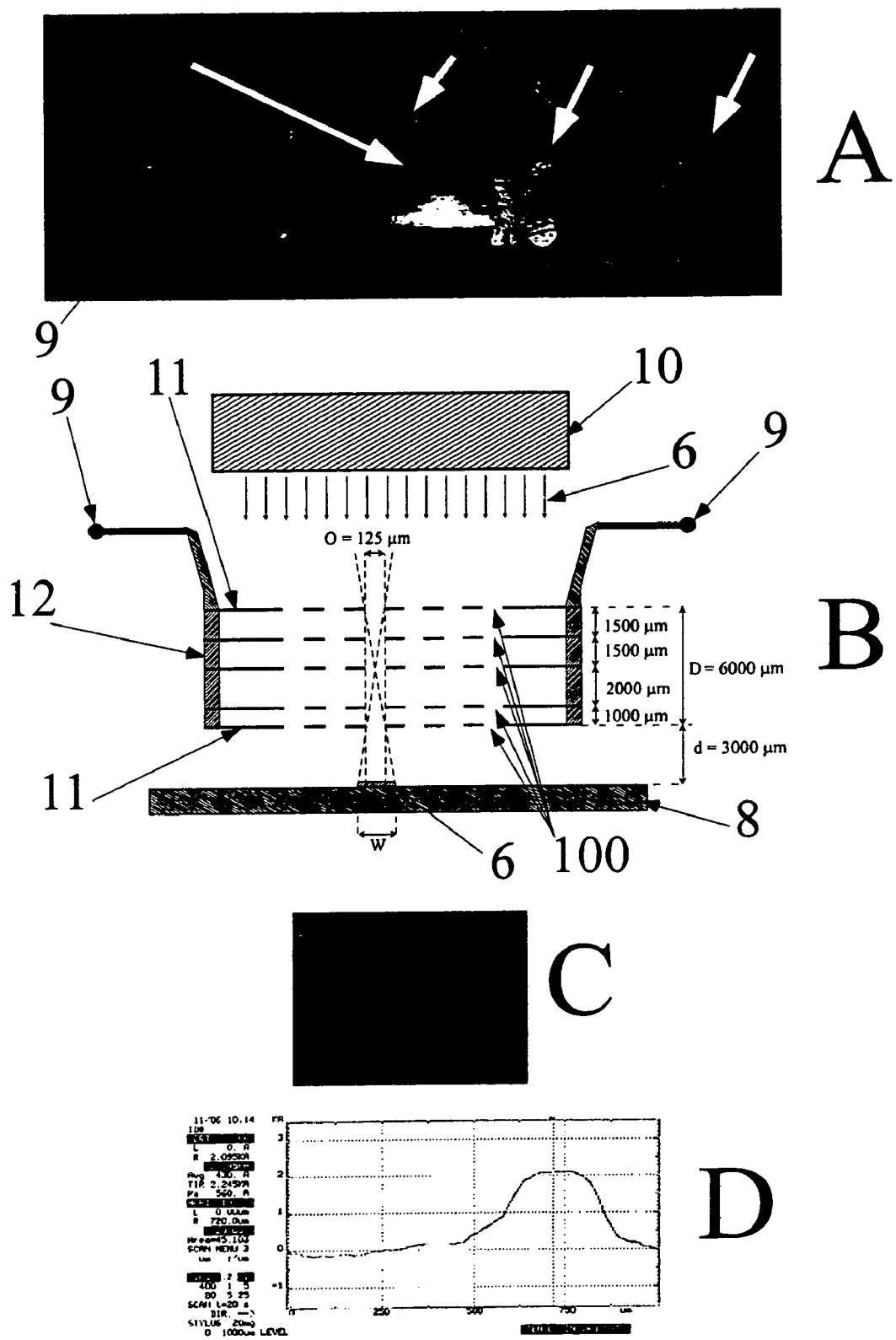
FIG. 4A is a photograph showing a heated collimating mask assembly with six line openings produced by electric discharge machining.
FIG. 4B is a schematic cross sectional view of a heated collimating aperiodic mask assembly and evaporation geometry.
FIG. 4C is a photograph of deposited films on a Si substrate in a pattern using the heated collimating mask assembly.
FIG. 4D is a graphic representation of the thickness profile of the deposited film.

FIG. 4A is a photograph of a heated collimating mask assembly. In accordance with FIG. 4B, the electrical terminals 9 are providing current to the individual shadow masks 11 through a stack of electrically conducting elements 12 bolted to the terminals 9. This mask assembly was constructed by stacking five tungsten-based individual shadow masks 11, each having 25 µm thickness. The schematic of the mask assembly and the various inter-element separations are shown in FIG. 4B. With apertures or openings 100 of 125 microns on 1200 microns centers, the aperiodic design shown in FIG. 4B eliminated the diagonal spurious deposits. Other inter-element spacings can be devised to achieve similar results.

The slots or openings 100 in the masks were cut using wire Electrical Discharge Machining (EDM). Other techniques, including but not limited to, laser machining and a variety of etching techniques such as plasma, ion beam and wet chemical etching, can be used.

Based on geometric considerations using a line of sight model, the width of the deposit W through a mask assembly with an aperture width O, the separation d between the bottom of the mask assembly and the substrate and the overall mask assembly thickness D are related by equation 1 below:

$$W = O \cdot (1 + 2d/D). \quad (1.$$

In this design, deposited feature widths W of 250 microns were targeted while maintaining a 3,000 micron substrate to mask separation d. Based on the 125 microns width apertures O, the overall mask assembly thickness D was 6000 microns.

FIG. 4C shows a photograph of stripes of a NPB [N,N'-Bis(naphthalene-1-yl)-N,N'-bis(phenyl)benzidine film deposited on a silicon substrate through the heated (150 to 170° C.) collimating mask assembly described above.

FIG. 4D shows the surface profile of the evaporated pattern. The full width at half maximum (FWHM) is ~257 microns, compared to a design goal of 250 microns.

Figure 5:
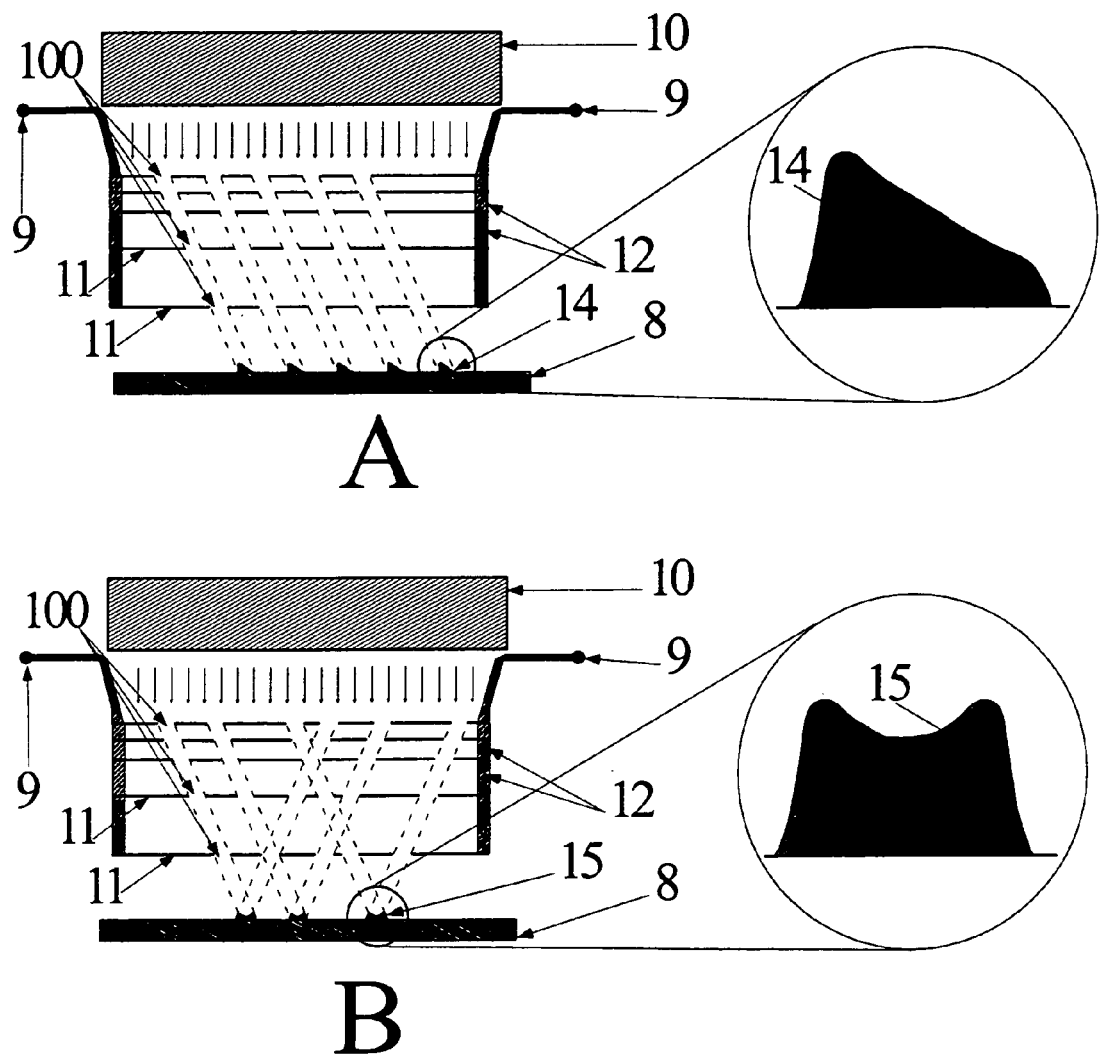
FIG. 5A is a cross sectional schematic representation of angle-of-incidence-controlled heated collimating mask assemblies along with its expected deposition profiles with a single-angle deposition.
FIG. 5B is a similar view of a collimating mask assembly with two angles of incidence simultaneously deposited on the same site.
FIG. 5C is a similar view showing sidewall build-up configuration on a previously deposited feature.
FIG. 5D is a similar view showing a two-source co-deposition configuration.
Figure 5:
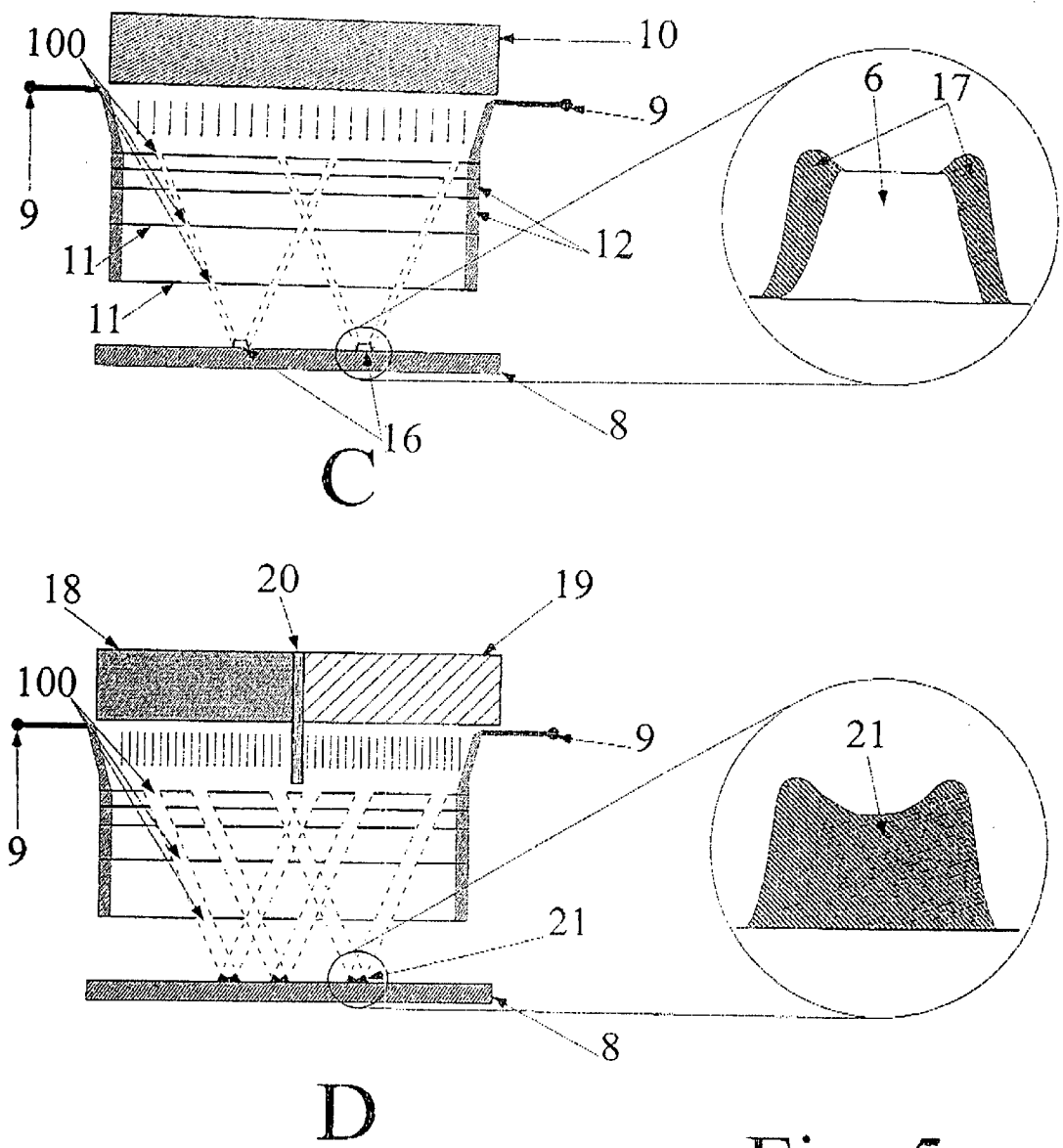

FIGS. 5A and 5B are schematic representations of a heated collimating mask assembly where the angle of incidence of the evaporant onto the substrate can be controlled by off-axis alignment of the apertures 100 to produce deposition beams arriving obliquely to the substrate. FIGS. 5A and 5B show two typical off-axis mask designs for depositing thin films at an oblique angle using the concept of aperiodically spaced individual shadow masks to ensure evaporant passage only at the designed angle. Such designs can find a number of uses in tailoring the fabrication of complex three-dimensional device structures. Here, instead of the normal incidence thin film deposition profile 6 shown in FIG. 4D, the oblique deposition results in a different deposition profile as shown at 14 and 15 in FIG. 5.

A separate oblique deposition design is shown in FIG. 5C. An already deposited pattern having a normal incidence thin film deposition profile 6 is modified by the oblique deposition of another film 17, which can either be the same or different material. This provides additional flexibility in lithography-free fabrication of multi-layered device structures.

Another embodiment of the use of oblique deposition is shown in FIG. 5D in which co-deposition from two sources 18 and 19 is achieved. Here, the two sources 18 and 19 are separated from each other by a baffle 20, preventing unwanted mixing of the two evaporants prior to entering the oblique pathways through the heated mask assembly. The resulting deposition 21 is a mixture of the two materials, the stoichiometry of which is controlled by the power applied to the sources 18 and 19 respectively.

The lower size limit of mask openings made by EDM, laser drilling or focused ion beam sources in a pre-assembled stack of individual shadow mask blanks is typically a few microns depending on the required thickness of the mask assembly (equation 1). This imposes strict limits on the thickness of the assembly through which apertures may be accurately realized. For example, in the case of laser machining we need to avoid broadening of the features due to diffraction limits, local heating effects, or lack of adequate collimation. Finer features can be achieved through the use of microlithography, although limited to an individual mask element. Use of this process dictates alignment and bonding of several elements with respect to each other, in order to achieve collimation.

Figure 6:
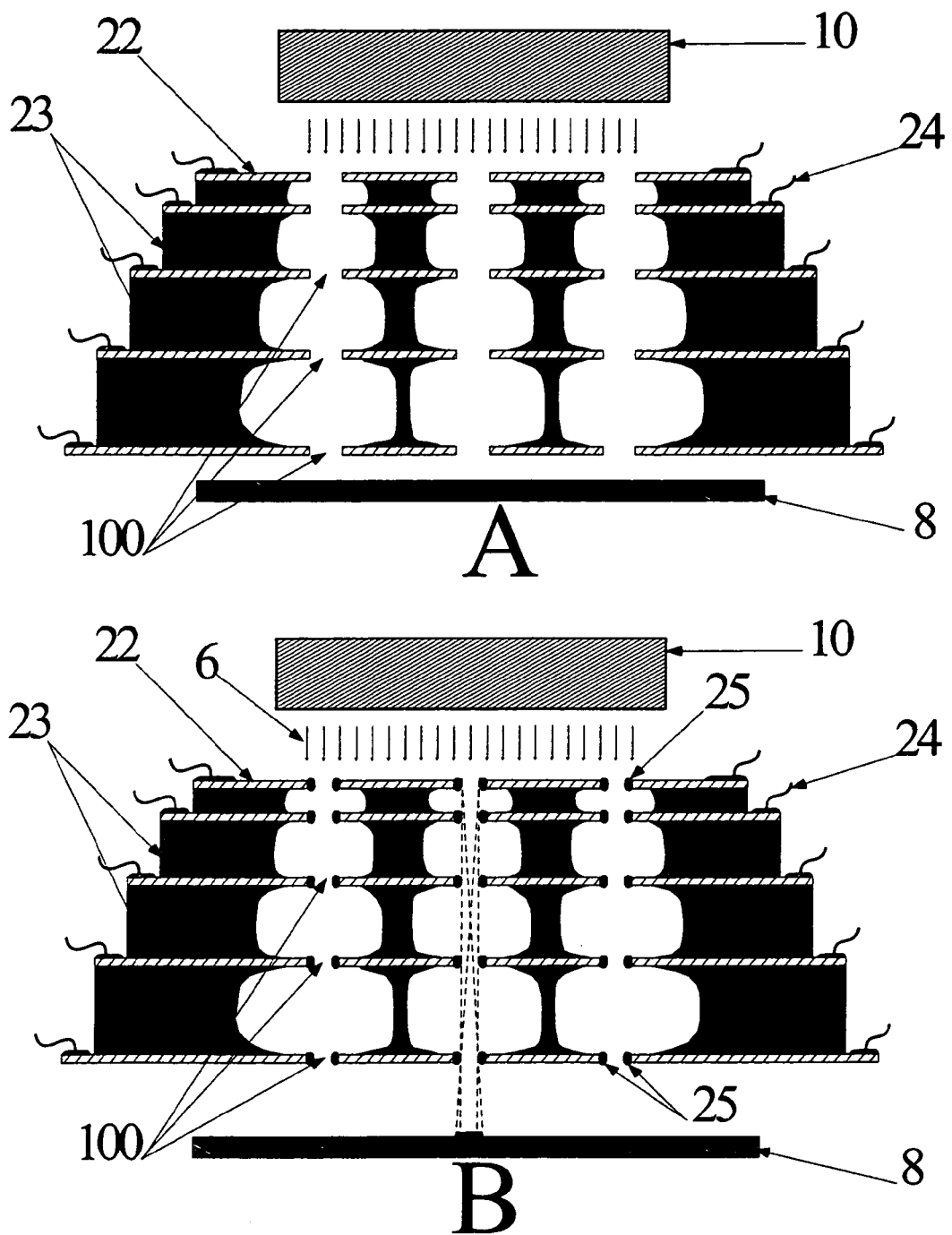
FIG. 6A is a cross sectional view of the several elements of the deposition assembly using a multilevel heated collimating mask assembly fabricated monolithically using Si shadow mask elements with glass spacers.
FIG. 6B is a similar view of a mask assembly with aperture size reduction.

FIG. 6A illustrates one such embodiment in which the stack of silicon (Si) wafers 22, is provided with electrical contacts 24 and bonded to alternating glass sheets 23 using conventional methods such as anodic bonding. Here, the glass can be a sacrificial layer and may be selectively removed through the Si openings. There are numerous examples in the MEM (micro-electro-mechanical) literature of anodic bonding of Si to glass. Advantages of such Si-on-glass structures are:
 (1) to vary the doping level and/or thickness of Si wafers to provide the means for resistive heating,
 (2) by proper choice of glass, to eliminate warping due to thermal expansion coefficient differences, and
 (3) known techniques for highly selective etching of glass can be used to remove it from between mask elements at desired locations.

The minimum size of the openings that can be produced in an integrated mask assembly generally increases as its overall thickness increases. These mask openings can be simultaneously narrowed throughout all of the individual masks by a controlled build-up of suitable material 25 on the respective edges of the openings as shown schematically in FIG. 6B. This can be accomplished before or after removing the sacrificial layers 23. Such material build-up can be performed by a number of methods such as, but not limited to, electroplating, electroless plating and self-assembly.

Figure 7:
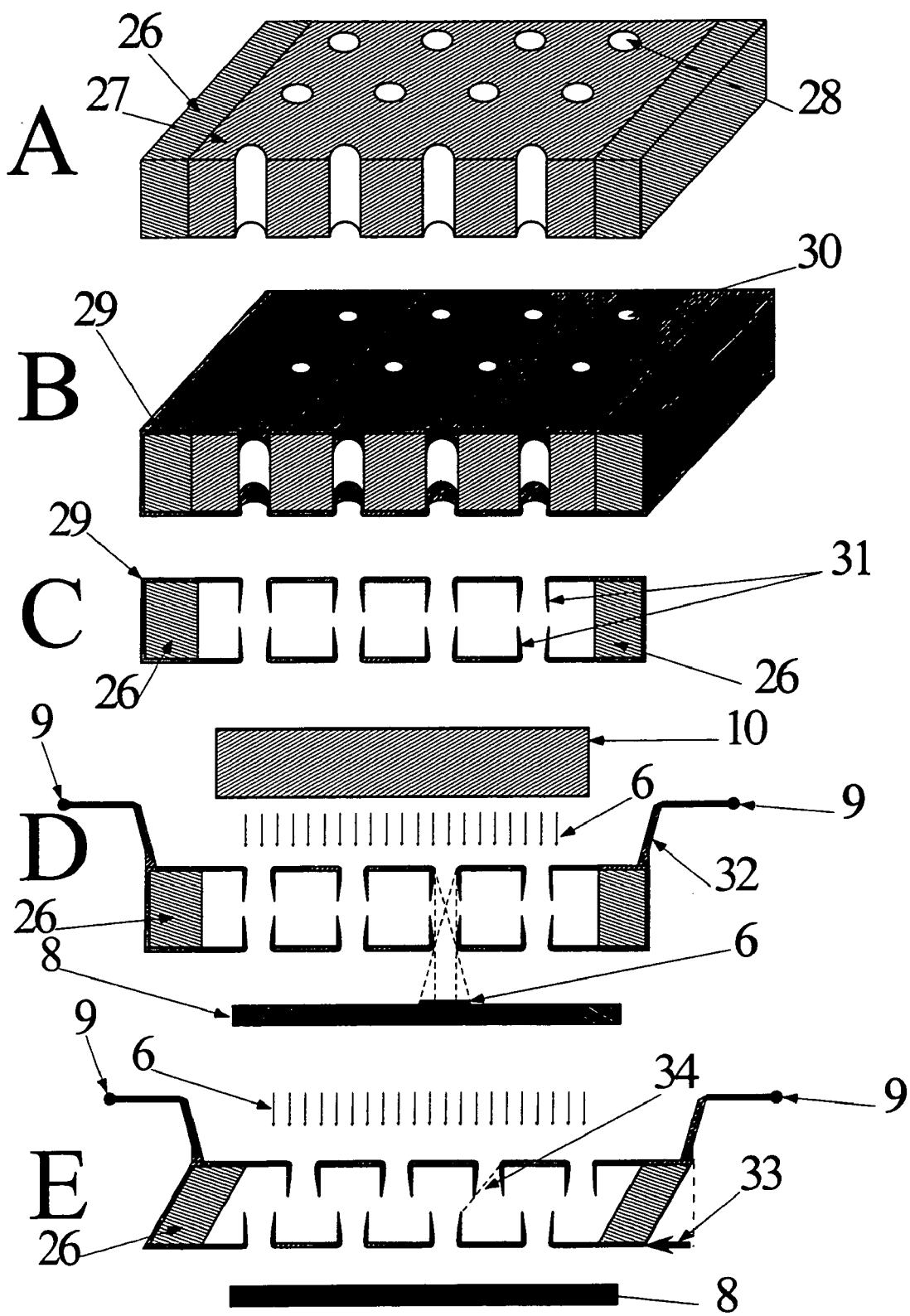
FIGS. 7A, 7B and 7C illustrate the steps in the fabrication of a two-element collimating heated mask assembly.
FIG. 7D shows the deposition assembly using the mask for deposition of the desired pattern.
FIG. 7E shows the mask functioning as a shutter mechanism activated by displacing one element with respect to the other.

Equipping such a collimating mask assembly with a shutter mechanism further enhances its versatility and permits better control of the deposition cycle. FIGS. 7A, 7B and 7C schematically represent one method for the fabrication of a two-level heated collimating mask assembly which will function as a shutter mechanism as shown in FIGS. 7D (shutter open) and 7E (shutter closed). This type of unit may be constructed using a variety of methods. In FIGS. 7A–7C, a sacrificial substrate 27 having passages 28 and a flexible hinge 26 is first coated with an electrically conductive material 29 (FIG. 7B). Oblique metal deposition on the pre-patterned substrate of FIG. 7B is followed by further electroless plating to build up the thickness of the metal to be mechanically robust. Thus there is formed 3-dimensional guards 31 around each set of openings 30 and controlled aperture size reduction (FIG. 6B) can be achieved. Alternatively, the mask blank 27 can be realized by starting from an undoped or lightly doped pre-patterned Si slab (FIG. 7A). Subsequently, by ion implantation, one can adjust both top and bottom surface conductivity to spatially control the thickness and position of the electroplated metal so that the desired 3-dimensional guards are obtained. This is followed by etching of the inner pre-patterned substrate 27 to obtain a structure that is supported by the flexible hinge 26, as shown in FIGS. 7C–7E.

Such structures can act as collimating mask assemblies when equipped with electrical contacts 32 and 9 (FIG. 7D).

These 3-dimensional guards 31 prevent the diagonal transport of the evaporant flux 6 as shown in FIG. 7D. With the help of an actuation mechanism 33, these 3-D guards act as shutters by blocking the line of sight path of the evaporant. The lateral displacement of the bottom part of the mask assembly with respect to the top part, acts as a controlled shutter mechanism that temporarily halts deposition without turning off the power to the evaporation source 10 and permits another deposition zone on the substrate to be presented to the heating element.

Figure 8:
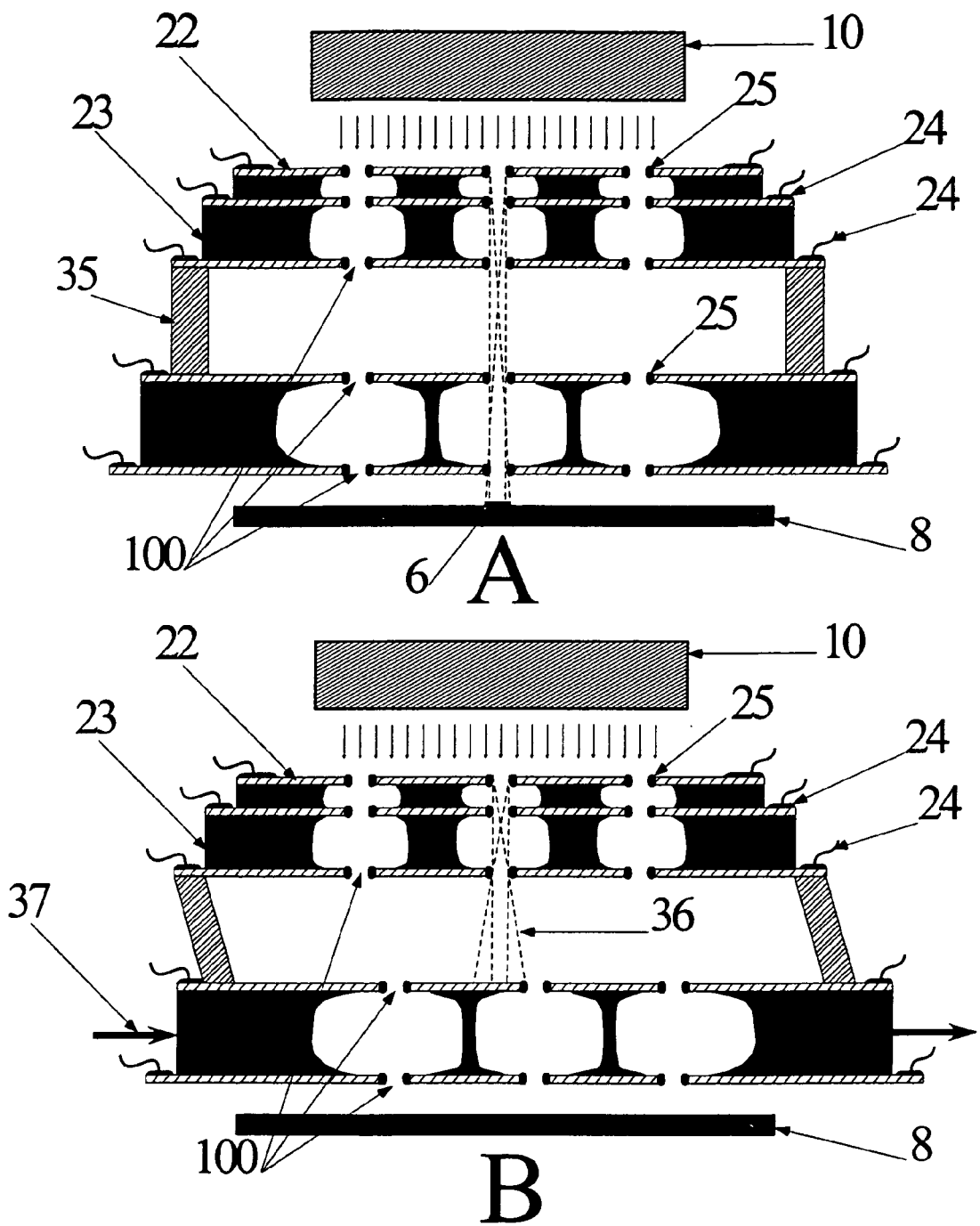
FIG. 8 illustrates two shutter configurations (8A and 8C respectively) for heated collimating mask assemblies employing a displacement of one mask element with respect to the other.
Figure 8:
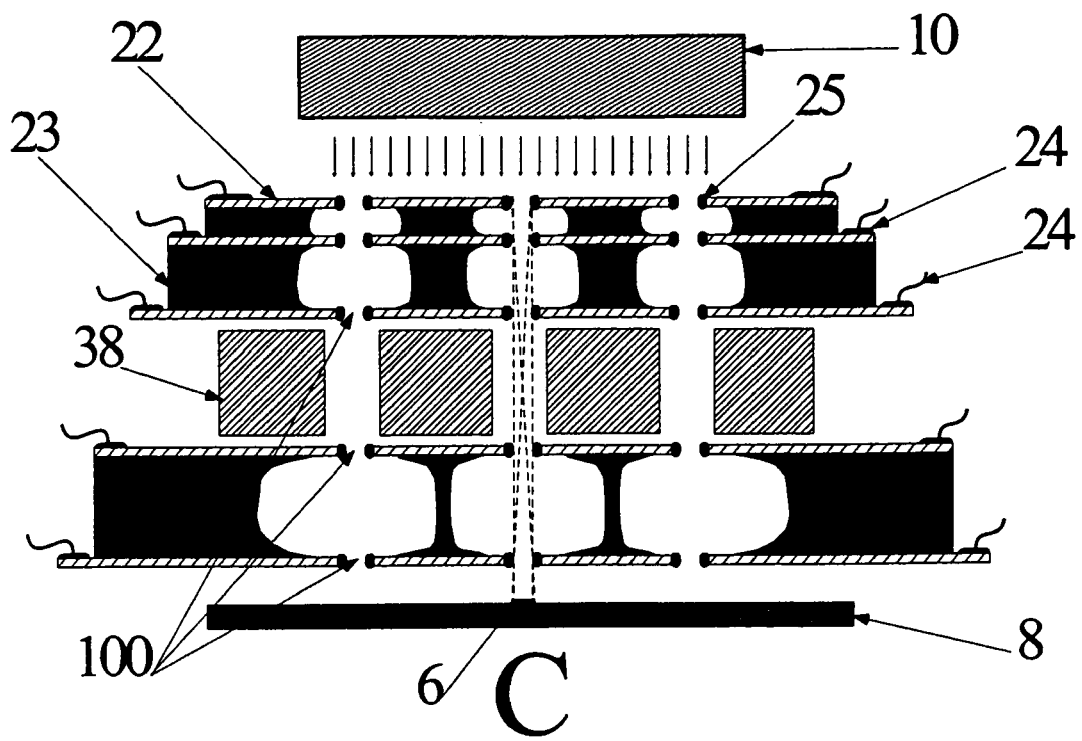
Figure 8:
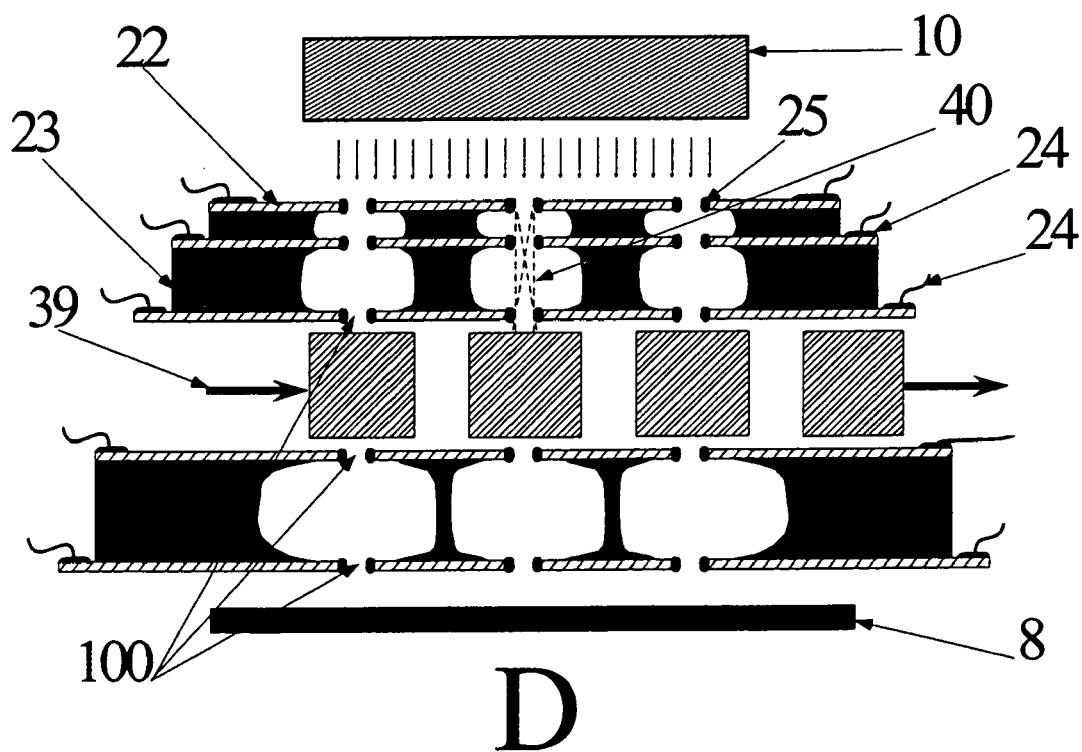

A variety of heated collimating mask assemblies outfitted with shutter mechanisms can be also produced using the technology outlined in FIGS. 6A and 6B. In particular, monolithic integration of Si/glass architectures, where one of the patterned elements incorporates a spring-hinged structure or a sliding element, can be also used to provide the means for such a shutter mechanism. A spring-hinged configuration is shown in FIGS. 8A and 8B where, with the help of a thin sidewall structure 35 and actuation mechanism 37, the lower half of the assembly is moved parallel to the top part, thus eliminating the aperture alignment and blocking the vapor stream 36. Alternatively, a shutter mechanism can be realized by making one of the mask elements within the stack 38 movable parallel to the stack as shown in FIGS. 8C and 8D. This lateral motion of the mask element 38 can be controlled by the use of an actuator 39 and a restoring spring element (not shown) which, when the movable element is moved into the right position, blocks the vapor stream 40.

Example of the method and apparatus of the present invention is the following specific example:

Five tungsten foils (1'×1'×0.001") are sandwiched with three metallic spacers having a thickness of 1000 microns, 2000 microns and 1500 microns, respectively. This assembly was clamped on its sides. The five tungsten foils were bonded with a vacuum compatible insulating material (to hold them in place once the metallic spacers are removed). Following this bonding the opening in the mask set were created in all the foils stacked together using electric discharge machining (EDM). At this point the metallic spacers were removed. The two ends of the stack were clamped to copper electrodes as shown in FIGS. 4A and 4B while preventing any distortion of the spacing between the tungsten foils containing openings.

The mask unit was placed between the substrate 8 and evaporation source 10 as shown in FIG. 4B with a substrate to mask assembly spacing of 3000 microns (3 mm). Current was applied to the source 10 to heat the NPB deposit thereon and effect its vaporization (c.a. 60–80 amperes), and current was simultaneously applied to the masks of the assembly 12 to heat them to a temperature of about 170° a and preclude deposition of the evaporant thereon. FIG. 4C shows the deposited NPB fil the silicon substrate. The thickness profile of the deposited film using a surface profilometer (Alphastep 200, TENCOR) is shown in FIG. 4D.

Although tungsten foil is a convenient material for making the masks, other materials may be used such as doped Si with adequate resistivity and thickness, and nichrome, molybdenum, and tantalum foils. In the case of silicon wafers (foils), various insulators (such as glass, pyrex, quartz) can be used as spacers. These spacers may be bonded using a variety of standard bonding techniques.

Mask openings can be realized by a variety of methods such as EDM, laser machining and ion beam etching. In addition, various techniques can be employed for the alignment of openings with respect to each other in individual mask foils. These techniques are useful to realize mask assemblies that enable evaporation at an oblique angle such as shown in FIG. 5. The oblique evaporation may be used to produce desired thickness profiles of the evaporated films.

Thus, it can be seen from the foregoing detailed specification and attached drawings that the collimating apparatus and method of the present invention provide effective and controlled SLEM deposition of patterns on a substrate.

REFERENCES (INFORMATION DISCLOSURE)

1. C. W. Tang, et al.: "Electroluminescence of Doped Organic Thin Films", J. Appl. Phys., 65, 1989, pp. 3610–3615.
2. J. R. Sheats, et al.: "Organic Electroluminescent Devices", Science, 273, 1996, pp. 884–888.
3. A. Ulman: "An Introduction to Ultrathin Organic Films from Langmuir-Blodgett to Self-Assembly". 1991, Boston, Mass.: Academic Press
4. R. W. Corkery: "Langmuir-Blodgett (L-B) Multilayer Films", Langmuir, 13(14), 1997, pp. 3591–3594.
5. G. G. Roberts: "Langmuir-Blodgett films", Contemp. Phys., 25(2), 1984, pp. 109–128.
6. D. L. Thomsen, et al.: "Zinc-bisquinoline coordination of high refractive index and film uniformity", J. Am. Chem. Soc., 120, 1998, pp. 6177–6178.
7. D. K. Schwartz: "Mechanisms and kinetics of self-assembled monolayer formation", Annual Review of Physical Chemistry, 52, 2001, pp. 107–137.
8. P. F. Nealey, et al.: "Micro- and nanofabrication techniques based on self-assembled monolayers", Molecular Electronics, 1997, pp. 343–367.
9. A. Terfort, et al.: "Three-dimensional self-assembly of millimeter-scale components", Nature (London), 386(6621), 1997, pp. 162–164.
10. G. M. Whitesides, et al.: "Organic chemistry in two dimensions: surface-functionalized polymers and self-assembled monolayer films", Chemtracts: Org. Chem., 1(3), 1988, pp. 171–187.
11. G. M. Whitesides, et al.: "Organized molecular assemblies", Crit. Rev. Surf. Chem., 3(1), 1993, pp. 49–65.
12. J. M. Shaw: "Overview of Polymers for Electronic and Photonic Applications", Polymers for Electronic and Photonic Applications, 1993, pp. 1–59.
13. E. Reichmanis: "The Chemistry of Polymers for Microlithographic Applications", Polymers for Electronic and Photonic Applications, 1993, pp. 67–1111.
14. Y. Xia, et al.: "Microcontact printing with a cylindrical rolling stamp. A practical step toward automatic manufacturing of patterns with submicrometer-sized features", Advanced Materials (Weinheim, Germany), 8(12), 1996, pp. 1015–1017.
15. Y. Xia, et al.: "Reduction in the size of features of patterned SAMs generated by microcontact printing with mechanical compression of the stamp", Adv. Mater. (Weinheim, Ger.), 7(5), 1995, pp. 471–473.
16. J. L. Wilbur, et al.: "Microfabrication by microcontact printing of self-assembled monolayers", Adv. Mater. (Weinheim, Ger.), 6(7/8), 1994, pp. 600–604.
17. T. W. Odom, et al.: "Improved pattern transfer in soft lithography using composite stamps", Langmuir, 18(13), 2002, pp. 5314–5320.
18. W. S. Beh, et al.: "Formation of patterned microstructures of conducting polymers by soft lithography and applications in microelectronic device fabrication", Advanced Materials (Weinheim, Germany), 11(12), 1999, pp. 1038–1041.

19. S. P. Speakman, et al.: "High performance organic semiconducting thin films: Ink jet printed polythiophene [rr-P3HT]", Organic Electronics, 2(2), 2001, pp. 65–73.
20. S.-C. Chang, et al.: "Multicolor organic light-emitting diodes processed by hybrid inkjet printing", Adv. Mater. (Weinheim, Ger.), 11(9), 1999, pp. 734–737.
21. Y. Yang, et al.: "Polymer light-emitting logos processed by the ink-jet printing technology", Proc. SPIE-Int. Soc. Opt. Eng., 3279(Light-Emitting Diodes: Research, Manufacturing, and Applications II), 1998, pp. 78–86.
22. Y. Yang, et al.: "Organic/polymeric electroluminescent devices processed by hybrid ink-jet printing", J. Mater. Sci.: Mater. Electron., 11(2), 2000, pp. 89–96.
23. F. Papadimitrakopoulos, et al.: "Single-Pass Growth of Multilayer Patterned Electronic and Photonic Devices Using a Scanning Localized Evaporation Methodology (SLEM)", U.S. Pat. Ser. No. 10/159,670, filing date Jun. 3, 2002.

The invention claimed is:

1. A scanning localized evaporation apparatus comprising:
   (a) a base for supporting a substrate;
   (b) a multilevel mask assembly spaced above said base, comprising a multiplicity of masks vertically spaced from each other and having patterned openings therethrough, wherein said openings in the mask elements are vertically aligned in a manner resulting in a collimated evaporant beam; wherein said multilevel mask assembly further includes spacers disposed between said multiplicity of masks to separate said masks from each other; wherein said masks are comprised of electrically resistive materials and said spacers are insulators;
   (c) an evaporant source spaced above said mask assembly;
   (d) means for electrically heating each of said masks separately and individually such that each said mask can be electrically heated to a temperature that is substantially different from the temperature to which the other masks are heated; wherein said means for electrically heating and said insulator spacers together constitute means adapted to form a controlled temperature gradient across said multilevel mask assembly; and
   (e) means for heating said evaporant source to evaporate a vaporizable material into a stream which passes through said openings of mask elements in said mask assembly to deposit on the substrate.

2. The scanning localized evaporation apparatus of claim 1, wherein the heating of individual masks is controlled across said mask assembly to obtain a desired temperature profile.

3. The scanning localized evaporation apparatus of claim 1, further comprising at least one moveable mask element disposed between said mask, and translatable to block the openings in the adjacent mask as a shutter to obtain a desired profile of evaporant on the said substrate.

4. The scanning localized evaporation apparatus of claim 3, wherein there is included an actuator for movement of said shutter.

5. The scanning localized evaporation apparatus of claim 1, wherein said base for supporting said substrate is mounted on a transport mechanism for moving and indexing said substrate.

* * * * *